United States Patent [19]

Amir

[11] Patent Number: 5,299,268
[45] Date of Patent: Mar. 29, 1994

[54] METHOD FOR DETECTING THE LOCATIONS OF LIGHT-REFLECTIVE METALLIZATION ON A SUBSTRATE

[75] Inventor: Israel Amir, Ewing, N.J.

[73] Assignee: AT&T Bell Laboratories, Murray Hill, N.J.

[21] Appl. No.: 800,670

[22] Filed: Nov. 27, 1991

[51] Int. Cl.[5] ............................................. G06K 9/00
[52] U.S. Cl. .................................... 382/8; 356/360; 348/126
[58] Field of Search ............... 382/8, 62, 67; 358/101, 358/106, 107; 250/563; 356/237, 360; H04N 7/00, 7/18

[56] References Cited

U.S. PATENT DOCUMENTS

| | | | |
|---|---|---|---|
| 4,549,206 | 10/1985 | Suzuki et al. | 358/106 |
| 4,653,104 | 3/1987 | Tamura | 382/1 |
| 4,692,690 | 9/1987 | Hara et al. | 324/73 PC |
| 4,731,860 | 3/1988 | Wahl | 382/41 |
| 4,811,410 | 3/1989 | Amir et al. | 382/8 |
| 4,873,651 | 10/1989 | Raviv | 364/513 |
| 4,965,665 | 10/1990 | Amir | 358/101 |
| 5,050,231 | 9/1991 | Watanabe et al. | 382/58 |
| 5,064,291 | 11/1991 | Reiser | 356/372 |
| 5,091,963 | 2/1992 | Litt et al. | 382/8 |
| 5,101,442 | 3/1992 | Amir | 382/41 |

OTHER PUBLICATIONS

B. Carrihill and R. Hummel, "Experiments with the Intensity Ratio Depth Sensor," *Computer Vision, Graphics, and Image Processing*, 32, 337–358 (1985).

Primary Examiner—Leo H. Boudreau
Assistant Examiner—Andrew W. Johns
Attorney, Agent, or Firm—Robert B. Levy

[57] ABSTRACT

The detection (e.g., mapping) of metallized features (14,16) on a surface (12) of a substrate (10), such as a printed circuit board, is accomplished by separately spanning the surface with first and second lines of light (30,32), which have known intensity profiles which, when normalized, spatially intersect. As each line of light is spanned across the surface (12), the light reflected from a successive one of a plurality of very thin strips, each distant from the intersection of the intensity profiles, is sensed. The ratio of the sensed intensity of the light reflected when the surface (12) is spanned by the first line of light to the second line of light is computed. For each successively imaged strip at which the ratio of the sensed intensities exceeds a predetermined threshold, there is metallization present.

3 Claims, 2 Drawing Sheets

METHOD FOR DETECTING THE LOCATIONS OF LIGHT-REFLECTIVE METALLIZATION ON A SUBSTRATE

TECHNICAL FIELD

This invention relates generally to a technique for detecting (e.g., mapping) areas of light-reflective metallization on a substrate, such as a printed circuit board or the like.

BACKGROUND OF THE INVENTION

Printed circuit boards are the common building block of virtually all modern day electronic equipment. Typical circuit boards are comprised of at least one layer of insulative material, such as FR-4 or glass epoxy, which has one or both of its major surfaces clad with metallization, e.g., copper or the like. The metallization on each surface is patterned, usually by well-known photolithographic techniques, to establish component-mounting areas (pads or metallized throughholes) which are selectively linked to each other by metallized connecting paths.

To allow mounting of more components on a circuit board of given area, the size and spacing between the metallized connecting paths is continually being reduced. In the past, the standard minimum spacing between the metallized connecting paths was on the order of 8 mils. Today, this is getting smaller.

The continued reduction in the spacing between the metallized connecting paths has required a corresponding reduction in allowable manufacturing tolerances. To achieve reduced manufacturing tolerances, more accurate techniques for inspecting the metallized connecting paths on the circuit board surface(s) must be employed if opens, shorts and design rule violations are to be detected. A common approach for accomplishing such automated inspection is to span the circuit board with a beam or line of light and measure the intensity of the light reflected from the board surface. Ideally, the metallized connecting paths and component-mounting areas ("features") on the circuit board should exhibit a much higher reflectivity than the circuit board itself, causing the light reflected from the features to have a greater intensity. However, the metallized features are sometimes tarnished and/or corroded so their reflectivity may be significantly decreased. As a consequence, the actual difference in the intensity (i.e., the contrast) of the light reflected from a metallized feature and from a non-metallized area on the circuit board may not be very great. When the contrast is small, the accuracy of the inspection is reduced.

In my now-allowed U.S. patent application Ser. No. 440,948, filed on Nov. 24, 1989, and assigned to the present assignee, a method and apparatus is disclosed for obtaining a three-dimensional image of the surface of a substrate, such as a printed circuit board. The three-dimensional imaging technique disclosed in this application is practiced by separately spanning the substrate with first and second lines of light. Each of the first and second lines of light is directed at the substrate at about the same angle to strike a successive one of a first and second plurality of strips of area, respectively, running across the substrate along a first axis parallel to the plane thereof.

The first and second lines of light each have known intensity profiles which, when normalized, will spatially intersect. In other words, each line of light has a known intensity variation along a second axis perpendicular to the first axis and perpendicular to the plane of the substrate. As each line of light is spanned across the substrate, there will be a line along the substrate at which the normalized intensity profile is the same for each line of light as for the other. As each line of light is spanned across the substrate, a linescan camera also spans the substrate to sense the intensity of the light reflected from a successive one of a set of third strips of area, each spaced close to the line of the intersection of the normalized intensity profiles. The ratio of the sensed intensities yields the height of the features in each successively imaged third strip. In this way, a three-dimensional image of the substrate surface can be obtained.

My three-dimensional imaging technique, as described above, can be employed to measure the height of metallized features. The disadvantage of this approach is that the height of the metallized features tends to be very small. Further, the received intensity profiles from the translucent circuit board surface are significantly different from the profiles attributed to the metallization on the board surface. This is because the light which strikes the non-metallized portions of the translucent board surface will spread within the surface itself, causing a change in the received profile. In general, the height-measurement technique described in my allowed application, Ser. No. 440,948, is not applicable for surfaces whose intensity profiles are different.

Thus, there is a need for a technique for inspecting a substrate, such as a printed circuit board, to detect the metallized areas thereon, which technique is robust and less susceptible to tarnishing and corrosion of the areas.

SUMMARY OF THE INVENTION

Briefly, in accordance with the invention, a technique is disclosed for detecting the locations of light-reflective metallized areas on a substrate, such as a printed circuit board. The technique is practiced by separately spanning the substrate with first and second lines of light, each directed at a successive one of a plurality of first and second thin strips of area, respectively, running across the substrate along a first axis parallel to the plane of the substrate. The first and second fines of light each have a known intensity profile, (i.e., a variation in intensity as measured from the center of the line along a second axis perpendicular to the plane of the substrate and orthogonal to the first axis). The profiles, when superimposed and normalized, will spatially intersect. As each line of light is spanned across the substrate, the intensity of the light is sensed, from successive one of a third plurality of thin strips of area, each third strip lying at a point distant from the spatial intersection of the normalized intensity profiles. The ratio of the intensity of the light reflected from each third strip, when illuminated by the first line of light, to the intensity when illuminated by the second line of light is then computed. For each third strip at which the ratio exceeds a predetermined threshold, a metallized feature is present.

By sensing the intensity of the light reflected from each successive third strip at a point distant from the intersection of the profiles of the first and second lines of light, the contrast between the light-reflective metallization on the substrate and the substrate is maximized. As a result, the detection of the metallization on the substrate is enhanced.

DETAILED DESCRIPTION

Figure 1:
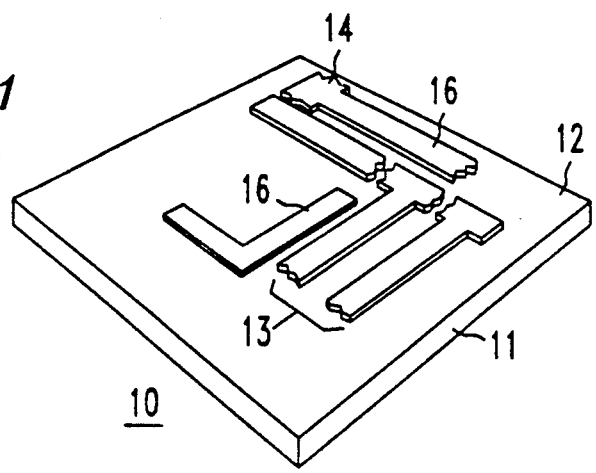
FIG. 1 is a perspective view of a circuit board, in accordance with the prior art, having a pattern of metallized component-mounting areas and metallized connecting paths on its major surface.

FIG. 1 is perspective view of a circuit board 10, according to the prior art, which is comprised of at least one layer 11 of insulative material, such as glass epoxy or FR-4. On at least one major surface 12 of the layer 11 is a pattern 13 of metallization which, in the illustrated embodiment, is comprised of a plurality of metallized connecting paths 16 linking selected component-mounting areas together.

In practice, the circuit board 10 is manufactured by first cladding the surface 12 with a thin layer of metallization, e.g., copper or the like, and then patterning the metallization by photolithographic techniques to yield the desired pattern 13. In the process of obtaining the pattern 13 of metallization on the surface 12, care must be taken so that none of the areas 14 and paths 16 are shorted to each other and there are no unintended open circuits. Further, care must be taken that no design rule violations are present (e.g., undesirable variations in the size of, and/or the spacing between, the component-mounting areas 14 and paths 16).

In accordance with the invention, a technique is provided for accurately detecting (e.g., mapping) the areas 14 and connecting paths 16 in the pattern of metallization 13 on the surface 12. To best understand the technique of the invention, reference should be had to FIG. 2 which is a side view of the circuit board 10. Each of a pair of lines of light $B_0$ and $B_1$ is shown directed at the board surface 12 so that the center of each line is coaxial with the center of a separate one of a pair of very thin strips 17 and 18, respectively, of area running along a first (x) axis parallel to the plane of the board and extending normal to the plane of the drawing. Each of the lines of light $B_0$ and $B_1$, although directed at a respective one of the strips 17 and 18, nonetheless illuminates an area on either side of the strip at which the line is directed since there is a certain degree of "spread" associated with each line of light. In other words, each of the lines of light $B_0$ and $B_1$ has a certain variation in intensity along a second (z) axis which runs perpendicular to the x axis.

Figure 2:
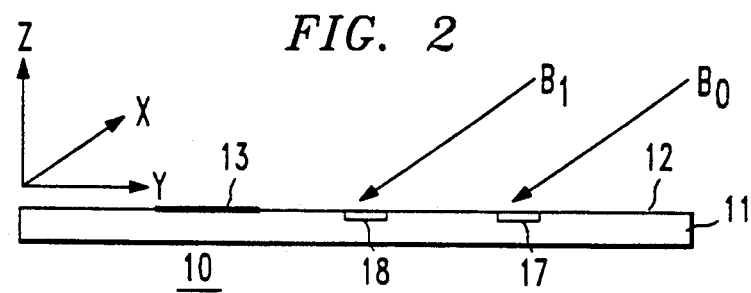
FIG. 2 is a side view of the substrate of FIG. 1, showing each of two separate lines of light directed thereat.
Figure 3:
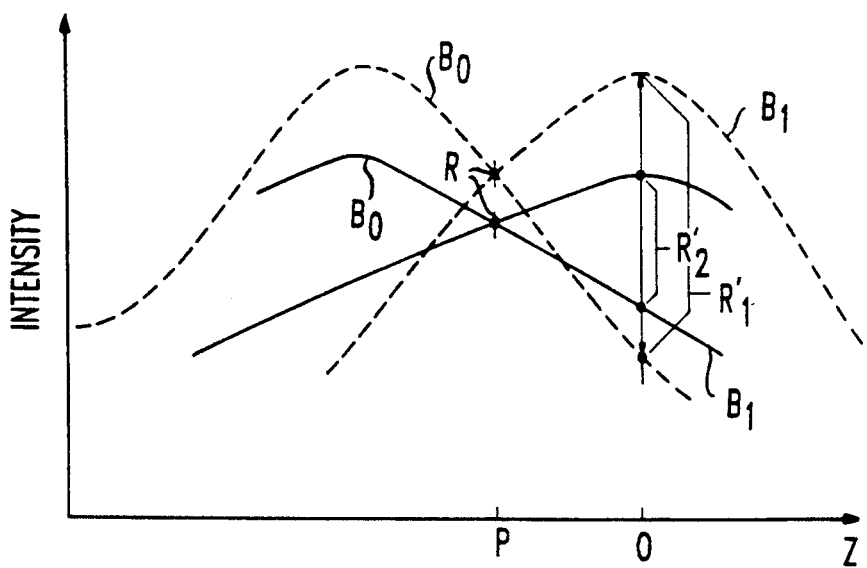
FIG. 3 is a graphical plot of the intensity profiles of the light reflected from metallization on the substrate and from the non-metallized portions of the substrate when illuminated by a separate one of the lines of light.

In FIG. 3, there is shown the normalized intensity profiles for each of the lines of light $B_0$ and $B_1$, respectively. Each solid curve represents the intensity profile for a separate one of the lines of light $B_0$ and $B_1$ when the strips 17 and 18, respectively, contain no part of the pattern 13 of metallization of FIG. 2. Each dashed curve represents the intensity profile when each line is directed at a separate one of the strips 17 and 18 that contains part of the pattern 13 of metallization. In practice, each of the intensity profiles shown in FIG. 3 tends to be bell-shaped, with the peak coinciding with the center of each of the lines of light $B_0$ and $B_1$.

Each intensity profile (i.e., the dashed curve) associated with the pattern 13 of metallization has a much steeper gradient than the profile (i.e., the solid line) associated with the non-metallized areas on the board surface 12 because of the translucent nature of the circuit board 10. As a consequence, the ratio of the intensity profiles for the metallized and non-metallized areas on the board surface 12 (i.e., the difference between the solid and dashed curves) is significantly different in regions distant from the intersection of the profiles, as seen in FIG. 3.

If both of the lines of light $B_0$ and $B_1$ were simultaneously directed at the surface 12 of FIG. 2, their intensity profiles would intersect along a line running along the x axis and passing through a point P on the z axis as seen in FIG. 3. Along this line passing through the point P, the ratio R of the intensity of the light reflected upwardly, when the surface 12 of FIG. 2 is spanned by the line $B_0$ to the intensity when the surface is spanned by the line of light $B_1$, is unity regardless of whether the metallization is present or not. Sensing the ratio of the light intensities along a line passing though a point close to P is advantageous from the standpoint of making a height measurement, as taught in my aforementioned patent application Ser. No. 440,948, since sensing the intensity of light in this region affords good dynamic range and allows a large range of heights to be measured. However, within this region, the difference in the ratio measurement between the metallized and non-metallized areas is relatively small, and thus may be adversely affected by a lack of contrast between the metallization in the pattern 13 of FIG. 2 and the non-metallized portion of the board surface 12.

Conversely, along a line passing through a point O which is distant from the point P, the ratio $(R_1')$ of the sensed intensities, when the lines $B_0$ and $B_1$ each illuminate an area containing part of the pattern 13 of metallization, will be significantly greater than the ratio $(R_2')$ of the intensities when the lines of light $B_0$ and $B_1$ illuminate a non-metallized area. As seen in FIG. 3, at the point O, there is a greater difference between the height of the two dashed curves and the two solid curves. Thus, it should be appreciated that by sensing the intensity of light reflected at a point distant from the intersection of the intensity profiles, there will be a greater difference between the intensity ratios when the lines of light $B_0$ and $B_1$ illuminate a metallized versus non-metallized area. In accordance with my present invention, detection of the metallized component-mounting areas 14 and connecting paths 16 can be enhanced by sensing the intensity of light reflected upwardly from the surface 12 at a point distant from the location where the normalized intensity profiles would spatially intersect.

Figure 4:
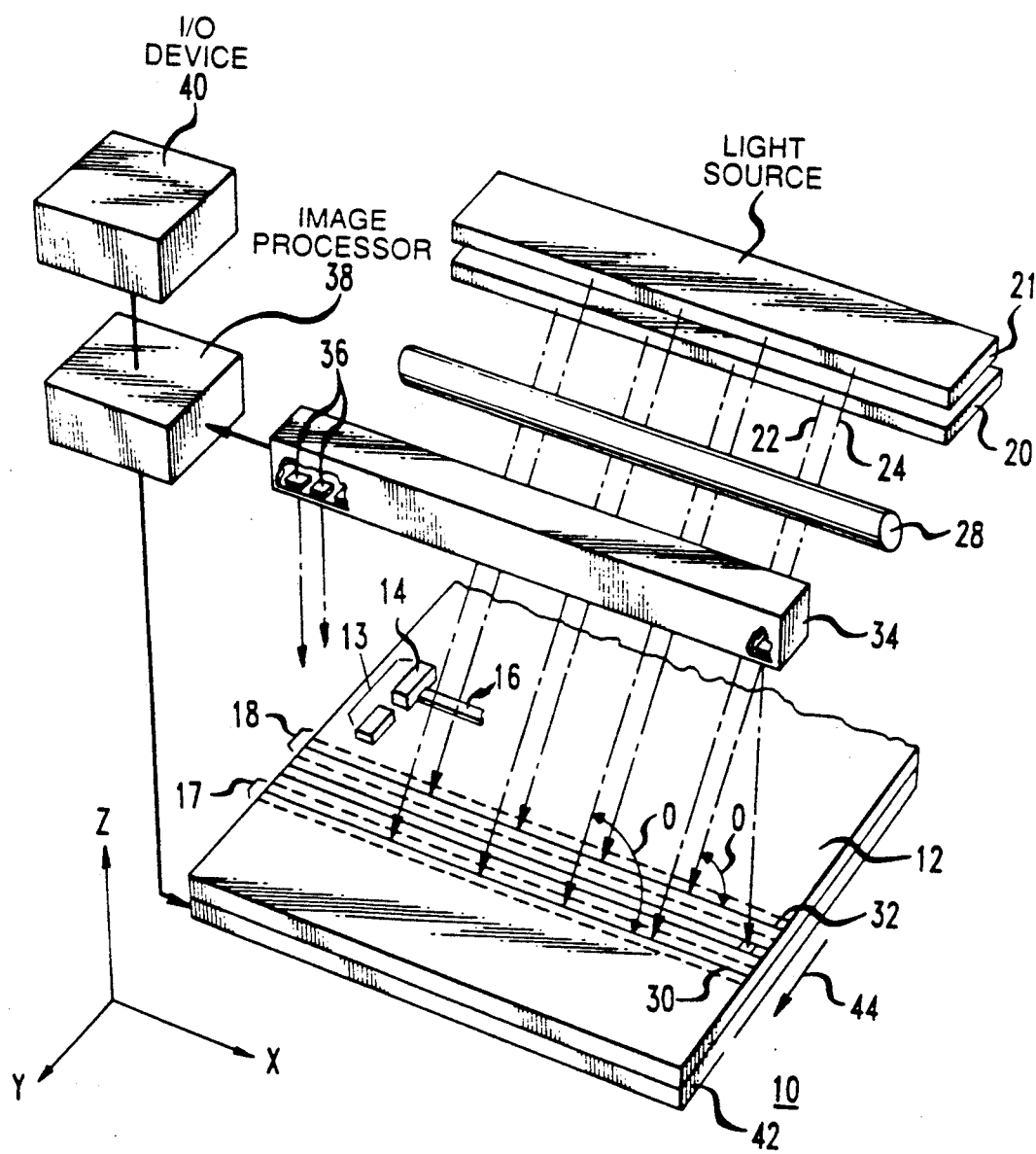
FIG. 4 is a block schematic diagram of a system for detecting metallization on the substrate of FIG. 1 in accordance with the technique of the invention.

Referring now to FIG. 4, there is shown a system 19 for inspecting the pattern 13 of metallization on the surface 12 of the circuit board 10 in accordance with the technique of the present invention. The system 19 is virtually identical to the system disclosed in my now-allowed patent application Ser. No. 440,948 and comprises a pair of light sources 20 and 21, each operative at separate intervals, as will be described below, to produce a plurality of individual beams of light 22 and 24, respectively. The beams 22 and 24, separately produced by each of the light sources 20 and 21, respectively, are directed into a circle-to-line converter 28 to yield first and second lines of light 30 and 32, respectively. Each of the lines of light 30 and 32 is directed at the center of a separate one of the thin strips 17 and 18, respectively, running across the circuit board surface 12 substrate parallel to the x axis.

Overlying the substrate is an image-acquisition device 34 in the form of a linescan camera as is well known in the art. The linescan camera 34 is comprised of a plurality of light-sensing elements 36, in the form of Charge-Coupled Devices (CCD's), arranged in a linear array to allow the linescan camera to sense the intensity of the light reflected from a strip of area (not shown) running across the board parallel to the strips 17 and 18. In accordance with the invention, the linescan camera 34 is positioned so as to sense the light reflected from a strip which is distant from line along which the intensity profiles of the lines of light 30 and 32 would, when normalized, spatially intersect. Referring to FIG. 4, the output of the linescan camera 34 is supplied to an image processor 38 whose details are described in U.S. Pat. No. 4,811,410, issued on Mar. 7, 1989, in the name of Israel Amir et al. The output of the image processor 38 is supplied to an input/output device 40 such as a CRT or the like.

To detect (i.e, map) the metallized component-mounting areas 14 and connecting paths 16 by the technique of the invention, the circuit board 10 must be separately spanned with the lines of light 30 and 32. At the same time the circuit board surface 12 is being spanned by a separate one of the lines of light 30 and 32, the board must be spanned by the linescan camera 34 to sense the intensity of the light reflected from a successive one of a plurality of strips (not shown), each distant from the line of spatial intersection of the normalized intensity profiles of the lines of light. In the illustrated embodiment, such spanning is accomplished by way of a motorized table 42 which serves to support the circuit board 10 and displace it along the y axis in the direction indicated by the arrow 44 under the control of the image processor 38, so that the board moves relative to the linescan camera 34 and each of the lines of light 30 and 32. Although not shown, means could alteratively be provided for displacing the light sources 20 and 21, the circle-to-line converter 28 and the linescan camera 34, all relative to the circuit board 10.

In operation, the circuit board 10 is displaced by the table 42 in the direction indicated by the arrow 44 while only a single one of the light sources 20 and 21 is rendered operative. In this way, the surface 12 is spanned by a corresponding one of the lines of light 30 and 32 and simultaneously by the linescan camera 34 which senses the light reflected from successive one of a plurality of very thin strips of areas, each a strip distant from the line along which the normalized profiles of the two lines of light would intersect. Thereafter, the circuit board 10 is returned by the table 42 to its original position. Now, the other of the light sources 20 and 21 is rendered operative and the board is spanned by the other of the lines of light 30 and 32 and at the same time, the linescan camera 34 senses the light reflected from each successive one of the plurality of strips distant from the line along which the normalized profiles of the two lines of light would intersect. (As an alternative to using the two light sources 20 and 21, a single light source (not shown) could be employed to generate a single line of light, and opposite sides of the (single) line could be used to generate the positively and negatively sloped profile portions by appropriately positioning the single light source during separate scans of the board surface 12.

Following the two scans of the circuit board 10 in this manner, the image processor 38 computes the ratio of the intensity sensed by the camera for each successively imaged strip during the first span by the first one of the lines of light 30 and 32 to each correspondingly imaged strip during the span by the other line of light. The computed ratio is then compared to a threshold value, typically a value between $R_1'$ and $R_2'$. If the intensity ratio for the imaged strip is greater than the threshold value, then the strip contains part of the metallized pattern 13. Otherwise no metallization is present. By plotting the intensity values which exceed the threshold, a map can be had of the metallized pattern 13.

The foregoing discloses a technique for detecting (i.e., mapping) the areas of metallization on a substrate.

It is to be understood that the above-described embodiments are merely illustrative of the principles of the invention. Various modifications and changes may be made thereto by those skilled in the art which will embody the principles of the invention and fall within the spirit and scope thereof.

I claim:

1. A method for detecting the location of light reflective areas of metallization on a first surface of a substrate, comprising the steps of:
   separately spanning the substrate first surface with each of a pair of lines of light, each directed at a successive one of first and second strips of area running across the substrate first surface along a first axis parallel to the plane of the substrate, each line of light having an intensity profile (i.e., a variation in intensity from the center of the line, as measured along a second axis lying in a plane normal to the substrate and perpendicular to the first axis), the profiles being separate from each other but, when normalized, spatially intersecting;
   sensing, at a location distance from the spatial intersection of the intensity profiles of the lines of light, the intensity of light reflected from a successive one of a plurality of third thin strips of area running across the substrate first surface parallel to the first and second strips; and
   mapping the areas of metallization on the substrate first surface in accordance with the ratio of the intensity reflectance for each third strip of area when the substrate first surface is successively spanned by the first and second lines of light.

2. The method according to claim 1 wherein the mapping step comprises the steps of:
   computing the ratio of the intensity of light reflected from each successive third strip when the substrate is spanned by the first line of light to the intensity for such successive third strip when the substrate is spanned by the second line of light;
   comparing the intensity ratio or its processed output to a threshold value; and
   establishing the presence of metallization in such successive third strip when the intensity ratio or its processed output exceeds the threshold.

3. The method according to claim 1 where the substrate is separately spanned by each of the first and second lines of light by the steps of:
   directing only the first line of light at the surface of the substrate;
   displacing the first line of light relative to the camera so that the first line of light spans the substrate surface;
   returning the substrate to its original position;
   directing only the second line of light at the substrate; and
   displacing the substrate relative to the second line of light so that the second line spans the substrate surface.

* * * * *